US009332342B2

(12) United States Patent
Kanaya et al.

(10) Patent No.: US 9,332,342 B2
(45) Date of Patent: May 3, 2016

(54) MICROPHONE AMPLIFIER CIRCUIT

(71) Applicant: Semiconductor Components Industries, LLC, Phoenix, AZ (US)

(72) Inventors: Masahito Kanaya, Ota (JP); Akio Watanabe, Sawa-gun (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 223 days.

(21) Appl. No.: 13/935,204

(22) Filed: Jul. 3, 2013

(65) Prior Publication Data

US 2014/0010384 A1 Jan. 9, 2014

(30) Foreign Application Priority Data

Jul. 5, 2012 (JP) ................................ 2012-151321

(51) Int. Cl.
*H03G 3/00* (2006.01)
*H04R 3/00* (2006.01)
*H04R 19/01* (2006.01)
*H04R 3/06* (2006.01)

(52) U.S. Cl.
CPC ................ *H04R 3/00* (2013.01); *H04R 19/016* (2013.01); *H04R 3/06* (2013.01); *H04R 2410/03* (2013.01)

(58) Field of Classification Search
CPC .......... H04R 3/00; H04R 19/016; H04R 3/06; H04R 2410/03; H03G 5/00
USPC .................. 381/104, 94.7, 95, 120, 113, 122
See application file for complete search history.

(56) References Cited

U.S. PATENT DOCUMENTS

2010/0254544 A1 10/2010 Kimura et al.
2011/0293115 A1* 12/2011 Henriksen .............. H03F 1/301 381/111
2013/0129117 A1* 5/2013 Thomsen ................ H04R 3/00 381/111

FOREIGN PATENT DOCUMENTS

| | | |
|---|---|---|
| EP | 1 096 831 | 5/2001 |
| JP | 2001-102875 | 4/2001 |
| JP | 2008-153981 | 7/2008 |
| JP | 2010-245729 | 10/2010 |

* cited by examiner

*Primary Examiner* — Vivian Chin
*Assistant Examiner* — Ammar Hamid

(57) ABSTRACT

The invention provides a microphone amplifier circuit which enhances the SNR (signal noise ratio) and expands the dynamic range by reducing the noise level. A microphone amplifier circuit includes a preamplifier which amplifies an audio signal from a capacitor microphone, a level detection circuit which outputs a level detection signal when the level of the audio signal is in the vicinity of the noise level of the microphone amplifier circuit, and an attenuator which attenuates the level of the audio signal outputted from the preamplifier in response to the level detection signal. The preamplifier includes an operational amplifier, a feedback capacitor and a feedback resistor.

20 Claims, 4 Drawing Sheets

MICROPHONE AMPLIFIER CIRCUIT

CROSS-REFERENCE OF THE INVENTION

This application claims priority from Japanese Patent Application No. 2012-151321, filed Jul. 5, 2012, the content of which is incorporated herein by reference in its entirety.

BACKGROUND OF THE INVENTION

1. Field of the Invention

The invention relates to a microphone amplifier circuit for a capacitor microphone.

2. Description of the Related Art

A MEMS microphone and an electret capacitor microphone (ECM) are known as a type of capacitor microphone.

The MEMS microphone is a capacitor including two electrode plates called a diaphragm and a back plate which face close to each other, and such a structure is formed on a silicon substrate by a MEMS (Micro Electro Mechanical Systems) technique. The MEMS microphone is resistant to the temperature of a standard solder reflow process, and is soldered on a printed board together with other components, for example.

In order to operate the MEMS microphone, a relatively high direct bias voltage is necessary. By applying this bias voltage, constant electric charge Q is charged in the capacitor forming the MEMS microphone. In this state, when the diaphragm vibrates by sound pressure, the electrostatic capacitance C of the capacitor changes to change voltage V between the terminals. The change of the voltage V is outputted as an audio signal.

On the other hand, the ECM uses an electret element which holds electric charge semipermanently and does not need a bias voltage.

A microphone amplifier circuit for a capacitor microphone is described in the Japanese Patent Application Publication Nos. 2010-245729, 2008-153981 and 2001-102875.

FIGS. 5A and 5B are conceptual diagrams showing the SNR (signal-noise ratio) characteristic of a conventional microphone amplifier circuit 30. FIG. 5A shows a case where the input conversion noise A of the microphone amplifier circuit 30 is larger than the noise M of a capacitor microphone 10 such as an ECM. In this case, the input conversion noise A is dominant as a noise source, and the SNR is the ratio of the audio signal S of the capacitor microphone 10 to the input conversion noise A which are amplified by the microphone amplifier circuit 30.

FIG. 5B shows a case where the input conversion noise A of the microphone amplifier circuit 30 is reduced to less than the noise M of the capacitor microphone 10. In this case, the noise M of the capacitor microphone 10 is dominant as a noise source, and the SNR is the ratio of the audio signal S of the microphone element 10 to the noise M of the capacitor microphone 10 which are amplified by the microphone amplifier circuit 30.

In other words, the noise of the microphone amplifier circuit 30 is determined by the larger of the input conversion noise A and the noise M of the capacitor microphone 10. Then, even if the input conversion noise A of the microphone amplifier circuit 30 is reduced as much as possible, the enhancement of the SNR is limited by the noise M of the capacitor microphone 10.

The invention is to provide a microphone amplifier circuit which enhances the SNR and expands the dynamic range of the microphone amplifier circuit.

SUMMARY OF THE INVENTION

A microphone amplifier circuit of the invention includes: a preamplifier amplifying an audio signal from a capacitor microphone; a level detection circuit outputting a level detection signal when a level of the audio signal is in a vicinity of a noise level of the microphone amplifier circuit; and an attenuator attenuating the level of the audio signal outputted from the preamplifier in response to the level detection signal.

DETAILED DESCRIPTION OF THE INVENTION

Figure 1:
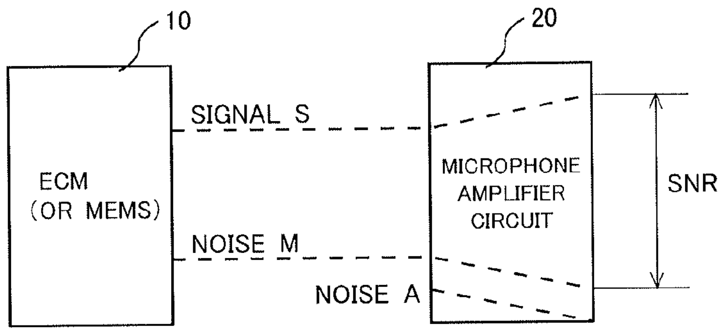
FIG. 1 is a conceptual diagram showing the signal noise characteristic of a microphone amplifier circuit of the invention.

FIG. 1 is a conceptual diagram showing the signal noise characteristic of a microphone amplifier circuit of the invention. An audio signal S and noise M from a capacitor microphone 10 such as an ECM or a MEMS microphone are amplified by a microphone amplifier circuit 20 and outputted.

The microphone amplifier circuit 20 has a control structure of controlling the gain of the microphone amplifier circuit 20 dynamically corresponding to the level of an audio signal S from the capacitor microphone 10, and reduces the noise level by reducing the gain by the control structure only when the level of the audio signal S is on an ultralow level in the vicinity of the noise level of the microphone amplifier circuit 20 (in this case, in the vicinity of the level of the noise M). The gain when the level of the audio signal S is higher than the vicinity of the noise level, i.e., the gain when there is a signal is left as it is, thereby resulting in the enhancement of the SNR and the dynamic range.

In this case, the SNR is defined as the ratio of the reference level of the audio signal S to the noise level when there is not a signal. That is, in the invention, the noise level differs between when there is a signal and when there is not a signal.

FIG. 1 shows a case where the input conversion noise A of the microphone amplifier circuit 20 is reduced to less than the noise M of the capacitor microphone 10 and the noise M is dominant. However, the concept is also applicable to the contrary case wherein the input conversion noise A of the microphone amplifier circuit 20 is dominant. In other words, in this case, the noise level of the microphone amplifier 20 is determined by the input conversion noise A.

First Embodiment

Figure 2:
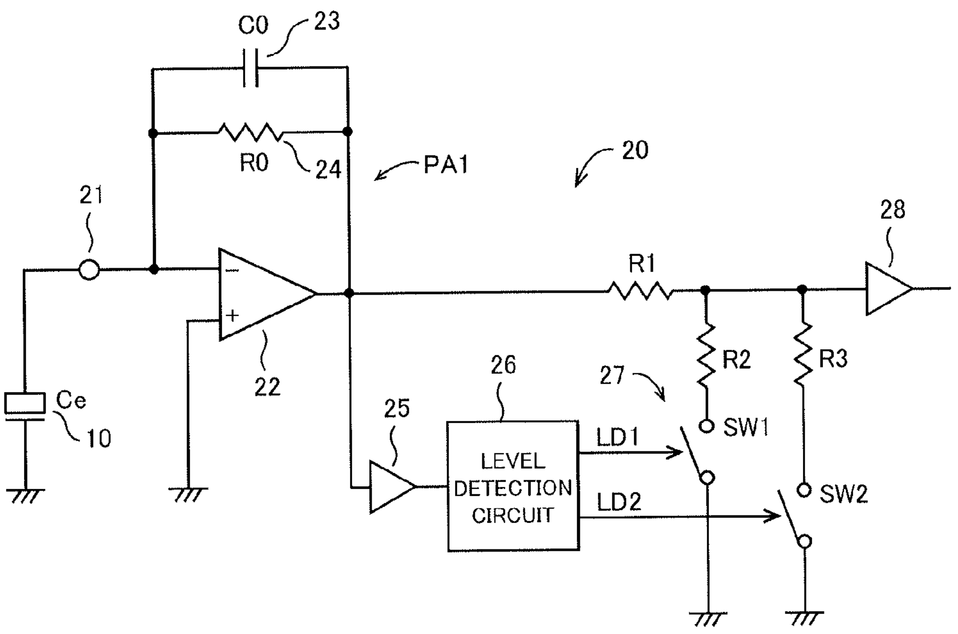
FIG. 2 is a circuit diagram of a microphone amplifier circuit in a first embodiment of the invention.

FIG. 2 is a circuit diagram of the microphone amplifier circuit 20 formed corresponding to the fundamental concept described above. The capacitor microphone 10 is connected to the inversion input terminal (−) of an operational amplifier 22 through a terminal 21 of the IC. The non-inversion input terminal (+) of the operational amplifier 22 is grounded. A capacitor 23 and a feedback resistor 24 are connected in parallel between the output terminal and the inversion input terminal (−) of the operational amplifier 22. The operational amplifier 22, the feedback capacitor 23 and the feedback resistor 24 form a preamplifier PA1.

The feedback resistor 24 is provided so as to stabilize the potential of the output terminal and the inversion input terminal (−) of the operational amplifier 22. In order to prevent an audio signal from the capacitor microphone 10 from passing from the inversion input terminal (−) to the output terminal of the operational amplifier 22 through the feedback resistor 24, the resistance value R0 of the feedback resistor 24 is set to an enough large value. When the resistance value R0 of the feedback resistor 24 is large enough, the gain of the preamplifier PA1 is Ce/C0. Ce is the capacitance of the capacitor microphone 10, and C0 is the capacitance of the feedback capacitor 23. The gain may be set to 1 or more, or set to 1 or less by the ratio of Ce/C0.

An audio signal amplified by the preamplifier PA1 is inputted to a level detection circuit 26 through an amplifier 25. The level detection circuit 26 outputs a first level detection signal LD1 when the level of the audio signal amplified by the preamplifier PA1 is lower than a first level which is in the vicinity of the noise level and higher than the noise level, and outputs a second detection signal LD2 when the level of the audio signal is lower than a second level which is higher than the noise level and lower than the first level. In this case, the noise level means the level of the larger of the input conversion noise A and the noise M of the capacitor microphone 10 as described above. The vicinity of the noise level is defined as a range between the noise level and the level higher than the noise level by 16 dB. It is preferable to set the first level to higher than the noise level by a range of 10 dB to 16 dB. It is preferable to set the second level to a range between the noise level and the first level. It is more preferable to set the second level to lower than the first level by 3 dB to 6 dB.

An attenuator 27 is provided on the stage next to the preamplifier PA1, and this is a circuit which attenuates the level of the audio signal outputted from the preamplifier PA1 in response to the first level detection signal LD1 and attenuates the level of the signal outputted from the preamplifier PA1 more largely in response to the second level detection signal LD2.

The attenuator 27 includes a first resistor R1 of which one end is connected to the output terminal of the preamplifier PA1, a second resistor R2 and a first switching element SW1 connected in series between the other end of the first resistor R1 and the ground, and a third resistor R3 and a second switching element SW2 connected in series between the other end of the first resistor R1 and the ground. The first switching element SW1 turns on in response to the first level detection signal LD1, and the second switching element SW2 turns on in response to the second level detection signal LD2. The audio signal passing through the attenuator 27 is outputted through a buffer 28. The first and second switching elements SW1, SW2 can be made of a MOS transistor or a bipolar transistor.

Figure 3:
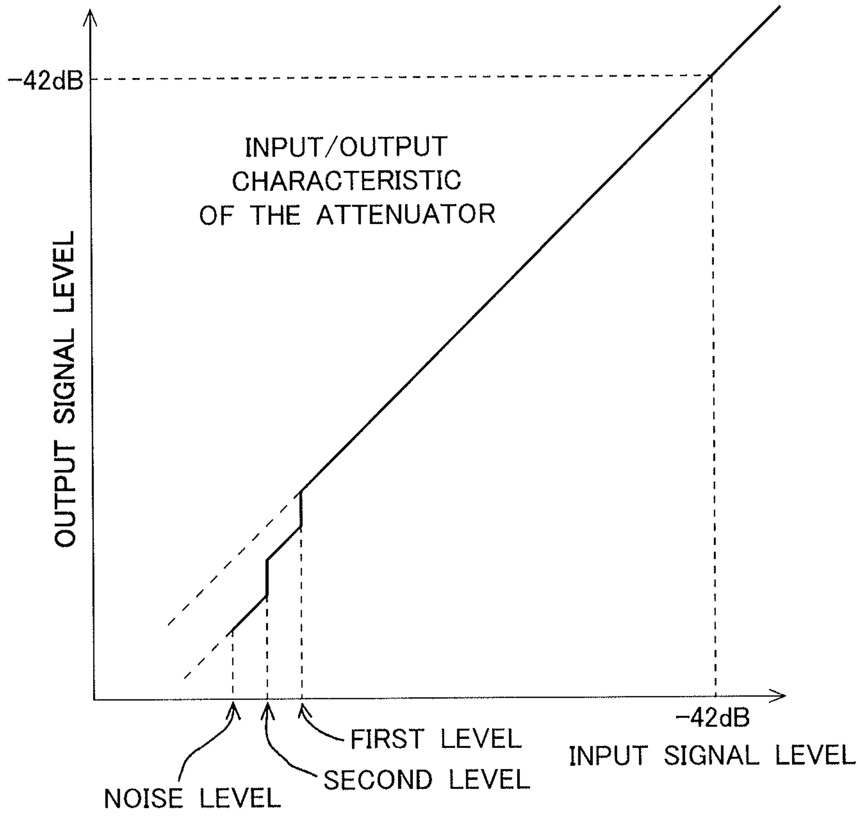
FIG. 3 is a graph showing the input output characteristic of an attenuator.

FIG. 3 is a graph showing the input output characteristic of the attenuator 27. In this case, the input signal level of the attenuator 27 is the level of an audio signal outputted from the preamplifier PA1. As shown in FIG. 3, when the level of the audio signal is higher than the first level, the first and second level detection signals LD1, LD2 are not outputted and the first and second switching elements SW1, SW2 turn off Therefore, the audio signal outputted from the preamplifier PA1 is outputted without attenuated. When the level of the audio signal becomes lower than the first level, the first level detection signal LD1 is outputted and the first switching element SW1 turns on in response to this. The second resistor R2 is then grounded through the conductive first switching element SW1, and thus the audio signal is attenuated.

When the audio signal level becomes lower than the second level, the second level detection signal LD2 as well as the first level detection signal LD1 is outputted, and the first and second switching elements SW1, SW2 turn on in response to these. Then the second resistor R2 and the third resistor R3 are grounded through the conductive first and second switching elements SW1, SW2, and thus the audio signal is attenuated more largely. The attenuation amount of the audio signal is adjustable by the resistance values of the second resistor R2 and the third resistor R3.

In this manner, only when the level of the audio signal is on an ultralow level in the vicinity of the noise level of the microphone amplifier circuit 20, the noise level is reduced by reducing the gain of the preamplifier PA1 by the attenuator 27. The gain when the level of the audio signal is higher than the first level, i.e., the gain when there is a signal is left as it is, thereby resulting in the enhancement of the SNR and the expansion of the dynamic range of the microphone amplifier circuit 20.

While the attenuator 27 performs a two-stage gain control using the first and second detection signals LD1, LD2 of the level detection circuit 26, the attenuator 27 may perform a one-stage gain control using only the first detection signal LD1 of the level detection circuit 26. In this case, the second resistor R3 and the second switching element SW2 of the attenuator 27 are omitted.

Furthermore, by increasing the number of the detection signals of the level detection circuit 26, the attenuator 27 may perform a three or more stage gain control. In this case, in the attenuator 27, the number of the switching elements and resistors connected in series is increased or decreased corresponding to the increase or decrease of the detection signals. By increasing the number of the gain control stages, the unnaturalness of audio due to the gain control is moderated.

Second Embodiment

Figure 4:
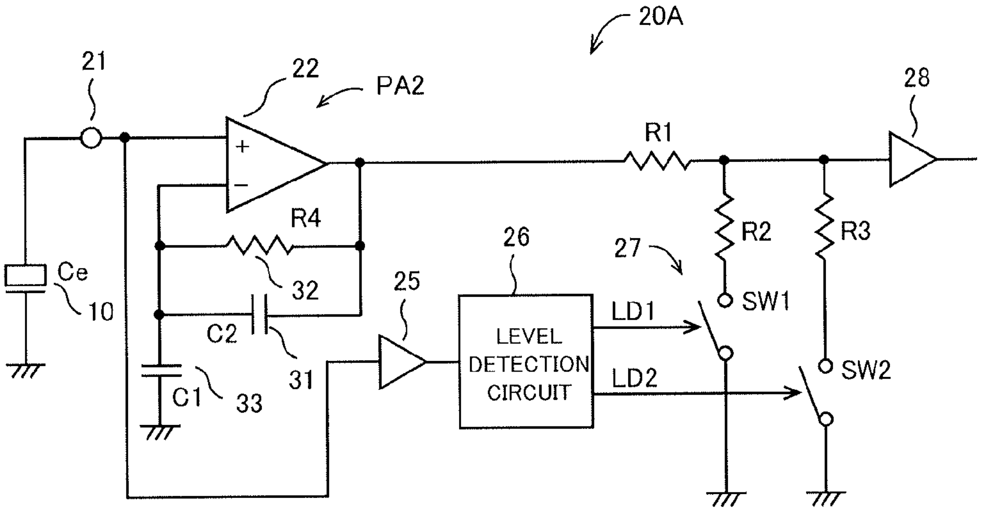
FIG. 4 is a circuit diagram of a microphone amplifier circuit in a second embodiment of the invention.
Figure 5A:
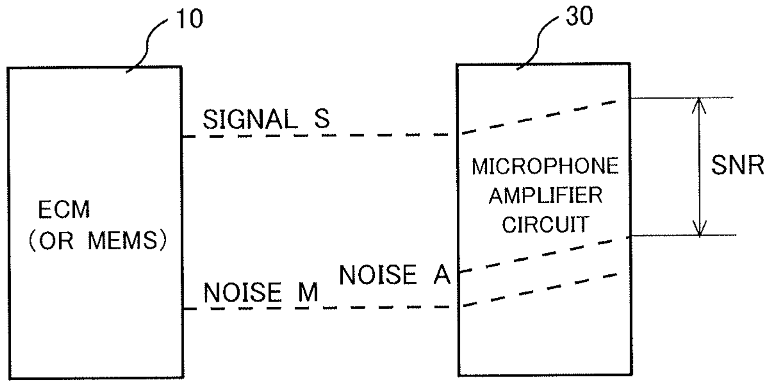
FIGS. 5A and 5B are conceptual diagrams showing the signal noise characteristic of a conventional microphone amplifier circuit.
Figure 5B:
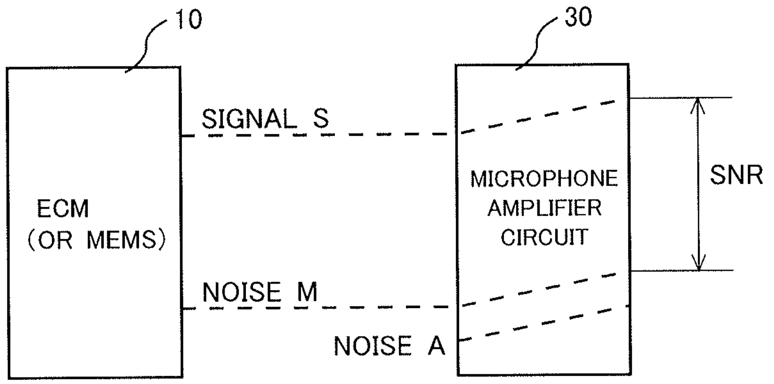

FIG. 4 is a circuit diagram of a microphone amplifier circuit 20A in a second embodiment. In this microphone amplifier circuit 20A, an audio signal from the capacitor microphone 10 is inputted to the level detection circuit 26 without through a preamplifier PA2. Therefore, the level detection circuit 26 detects the level of the audio signal outputted from the capacitor microphone 10 which is not amplified by the preamplifier PA2 yet.

In this case, the capacitor microphone 10 is connected to the non-inversion input terminal (+) of the operational amplifier 22 through the terminal 21 of the IC. The inversion input terminal (−) is grounded through a first capacitor 33. A second capacitor 31 and a feedback resistor 32 are connected in parallel between the output terminal and the inversion input terminal (−) of the operational amplifier 22.

The resistance value R4 of the feedback resistor 32 is set to an enough large value from the same reason as the reason for the circuit of the first embodiment. When the resistance value R4 of the feedback resistor 32 is large enough, the gain of the preamplifier PA2 is (1+C1/C2). C1 is the capacitance of the first capacitor 33, and C2 is the capacitance of the second capacitor 31. The other structure is the same as that of the first embodiment.

In the second embodiment, too, only when the level of an audio signal is on an ultralow level in the vicinity of the noise level of the microphone amplifier circuit 20A, the noise level is reduced by reducing the gain of the preamplifier PA2 by the attenuator 27, thereby enhancing the SNR and expanding the dynamic range of the microphone amplifier circuit 20A.

A microphone amplifier circuit of the invention enhances the SNR and expands the dynamic range since the level of an audio signal outputted from the preamplifier is attenuated only when the level of the audio signal is in the vicinity of the noise level of the microphone amplifier circuit.

What is claimed is:

1. A microphone amplifier circuit comprising:

a preamplifier amplifying an audio signal from a capacitor microphone and having a predetermined gain, wherein the preamplifier comprises an operational amplifier having a first capacitor and a feedback resistor each coupled between an output terminal and an input terminal of the operational amplifier to set a gain thereof;

a level detection circuit having an input coupled to one of the audio signal and an output of the preamplifier and outputting a level detection signal when a level of the audio signal is in a vicinity of a noise level of the microphone amplifier circuit; and an attenuator attenuating the level of the audio signal outputted from the preamplifier in amounts varying in response to a state of the level detection signal.

2. The microphone amplifier for claim 1, wherein the attenuator comprises a first resistor having one end connected to an output terminal of the preamplifier and comprises a second resistor and a switching element that are connected in series between another end of the first resistor and a ground, wherein the switching element turns on in response to the level detection signal.

3. The microphone amplifier circuit of claim 1, wherein the level detection circuit detects the level of the audio signal which is amplified by the preamplifier.

4. The microphone amplifier circuit of claim 1, wherein the level detection circuit detects the level of the audio signal which is not amplified by the preamplifier.

5. The microphone amplifier circuit of claim 1, wherein the preamplifier comprises the operational amplifier comprising an inversion input terminal, a non-inversion input terminal and an output terminal, and comprises the first capacitor and the feedback resistor connected in parallel between the output terminal and the inversion input terminal, wherein the capacitor microphone is connected to the inversion input terminal, the non-inversion input terminal is grounded, and an output of the operational amplifier is inputted to the level detection circuit.

6. The microphone amplifier circuit of claim 1, wherein the preamplifier comprises the operational amplifier comprising an inversion input terminal, a non-inversion input terminal and an output terminal, and comprises a second capacitor connected between the inversion input terminal and a ground, and comprises the first capacitor and the feedback resistor that are connected in parallel between the output terminal and the inversion input terminal, wherein the capacitor microphone is connected to the non-inversion input terminal and an output of the capacitor microphone is inputted to the level detection circuit.

7. The microphone amplifier circuit of claim 1, wherein the capacitor microphone comprises a MEMS microphone.

8. The microphone amplifier circuit of claim 1, wherein the capacitor microphone comprises an electret capacitor microphone.

9. A microphone amplifier circuit comprising:

a preamplifier amplifying an audio signal from a capacitor microphone and having a predetermined gain, wherein the preamplifier comprises an operational amplifier having a first capacitor and a feedback resistor each coupled between an output terminal and an input terminal of the operational amplifier to set a gain thereof;

a level detection circuit having an input coupled to one of the audio signal and an output of the preamplifier and outputting a first level detection signal when a level of the audio signal is lower than a first level which is in a vicinity of a noise level of the microphone amplifier circuit and higher than the noise level, and outputting a second level detection signal when the level of the audio signal is lower than a second level which is higher than the noise level and lower than the first level; and an attenuator attenuating the level of the audio signal outputted from the preamplifier by a first amount in response to the first level detection signal, and attenuating the level of the signal outputted from the preamplifier by a second amount larger than the first amount in response to the second level detection signal.

10. The microphone amplifier circuit of claim 9, wherein the attenuator comprises a first resistor having one end connected to an output terminal of the preamplifier, comprises a second resistor and a first switching element that are connected in series between another end of the first resistor and a ground, and comprises a third resistor and a second switching element that connected in series between the another end of the first resistor and the ground, wherein the first switching element turns on in response to the first level detection signal, and the second switching element turns on in response to the second level detection signal.

11. The microphone amplifier circuit of claim 9, wherein the level detection circuit detects the level of the audio signal which is amplified by the preamplifier.

12. The microphone amplifier circuit of claim 9, wherein the level detection circuit detects the level of the audio signal which is not amplified by the preamplifier.

13. The microphone amplifier circuit of claim 11, wherein the preamplifier comprises the operational amplifier comprising an inversion input terminal, a non-inversion input terminal and an output terminal, and comprises the first capacitor and the feedback resistor connected in parallel between the output terminal and the inversion input terminal, wherein the capacitor microphone is connected to the inversion input terminal, the non-inversion input terminal is grounded, and an output of the operational amplifier is inputted to the level detection circuit.

14. The microphone amplifier circuit of claim 12, wherein the preamplifier comprises the operational amplifier comprising an inversion input terminal, a non-inversion input terminal and an output terminal, and comprises a second capacitor connected between the inversion input terminal and a ground, and comprises the first capacitor and the feedback resistor that are connected in parallel between the output terminal and the inversion input terminal, wherein the capacitor microphone is connected to the non-inversion input terminal, and an output of the capacitor microphone is inputted to the level detection circuit.

15. The microphone amplifier circuit of claim 9, wherein the capacitor microphone comprises a MEMS microphone.

16. The microphone amplifier circuit of claim 9, wherein the capacitor microphone comprises an electret capacitor microphone.

17. A microphone amplifier circuit comprising:

a first amplifier amplifying an audio signal from a capacitor microphone and having a predetermined gain, wherein the first amplifier comprises an operational amplifier having a first capacitor and a feedback resistor each coupled between an output terminal and an input terminal of the operational amplifier to set a gain thereof;

a second amplifier further amplifying one of the audio signal and an output of the first amplifier;

a level detection circuit inputted with the audio signal amplified by the second amplifier and outputting a level detection signal when a level of the audio signal is in a vicinity of a noise level of the microphone amplifier circuit; and an attenuator attenuating the level of the audio signal outputted from the first amplifier in amounts varying in response to a state of the level detection signal.

18. The microphone amplifier circuit of claim 17, wherein the attenuator comprises a first resistor having one end connected to an output terminal of the first amplifier, and comprises a second resistor and a switching element that are connected in series between another end of the first resistor and a ground, wherein the switching element turns on in response to the level detection signal.

19. The microphone amplifier circuit of claim 17, wherein the first amplifier comprises the operational amplifier comprising an inversion input terminal, a non-inversion input terminal and an output terminal, and comprises the first capacitor and the feedback resistor connected in parallel between the output terminal and the inversion input terminal, wherein the capacitor microphone is connected to the inversion input terminal, the non-inversion input terminal is grounded, and an output of the operational amplifier is inputted to the second amplifier.

20. The microphone amplifier circuit of claim 17, wherein the capacitor microphone comprises a MEMS microphone or an electret capacitor microphone.

* * * * *